(12) United States Patent
Louderback

(10) Patent No.: US 9,468,085 B2
(45) Date of Patent: Oct. 11, 2016

(54) METHOD AND APPARATUS FOR IMPLEMENTING OPTICAL MODULES IN HIGH TEMPERATURES

(71) Applicant: Zephyr Photonics Inc., Zephyr Cove, NV (US)

(72) Inventor: Duane Louderback, Zephyr Cove, NV (US)

(73) Assignee: ZEPHYR PHOTONICS INC., Zephyr Cove, NV (US)

( * ) Notice: Subject to any disclaimer, the term of this patent is extended or adjusted under 35 U.S.C. 154(b) by 222 days.

(21) Appl. No.: 14/135,160

(22) Filed: Dec. 19, 2013

(65) Prior Publication Data
US 2014/0185312 A1 Jul. 3, 2014

Related U.S. Application Data

(60) Provisional application No. 61/747,300, filed on Dec. 29, 2012.

(51) Int. Cl.
| | |
|---|---|
| *F21V 5/00* | (2015.01) |
| *H05K 1/02* | (2006.01) |
| *H01L 33/64* | (2010.01) |
| *H01S 5/024* | (2006.01) |
| *F21V 29/54* | (2015.01) |

(Continued)

(52) U.S. Cl.
CPC ............ *H05K 1/0203* (2013.01); *F21V 29/54* (2015.01); *H01L 23/24* (2013.01); *H01L 33/645* (2013.01); *H01S 5/02248* (2013.01); *H01S 5/02415* (2013.01); *H05K 2201/10106* (2013.01); *H05K 2201/10219* (2013.01); *Y10T 29/4913* (2015.01)

(58) Field of Classification Search
CPC ...... F21V 29/54; H05K 1/0203; H01L 23/34
USPC ......................................................... 362/580
See application file for complete search history.

(56) References Cited

U.S. PATENT DOCUMENTS

| | | |
|---|---|---|
| 4,767,168 A | 8/1988 | Grandy |
| 4,811,361 A | 3/1989 | Bacou et al. |

(Continued)

OTHER PUBLICATIONS

Dutton, Harry J.R., "Understanding Optical Communications," IBM, International Technical Support Organization, Retrieved from http://www.redbooks.ibm.com, 638 pages.

(Continued)

*Primary Examiner* — Sean Gramling
(74) *Attorney, Agent, or Firm* — Pillsbury Winthrop Shaw Pittman LLP

(57) ABSTRACT

An optical module apparatus and method operates at high temperatures. The apparatus has a first printed circuit board with optoelectronics and electronics located on a thermoelectric cooler. The thermoelectric cooler is located on a second printed circuit board that also has electronics that control the thermoelectric cooler separately mounted thereon. The optical module operates at substantially higher temperatures by placing the optoelectronics and the electronics, not including the thermoelectric cooler controller, on the thermoelectric cooler. The electronics controlling the thermoelectric cooler only require relatively simple, low-speed electronics that are implemented in integrated circuit technologies. The integrated circuit electronics may operate at very high temperatures (200° C. or higher) thereby making control of the thermoelectric cooler with uncooled electronics possible.

23 Claims, 1 Drawing Sheet

(51) Int. Cl.
*H01L 23/24* (2006.01)
*H01S 5/022* (2006.01)

(56) References Cited

U.S. PATENT DOCUMENTS

| | | | |
|---|---|---|---|
| 4,895,426 A | 1/1990 | Pinson | |
| 4,930,049 A | 5/1990 | Davenport et al. | |
| 5,212,750 A | 5/1993 | Wright | |
| 5,771,114 A | 6/1998 | Andersson et al. | |
| 5,844,236 A | 12/1998 | Wilson | |
| 6,052,248 A | 4/2000 | Reed et al. | |
| 6,052,632 A | 4/2000 | Iihoshi et al. | |
| 6,222,976 B1 | 4/2001 | Shahid | |
| 6,351,590 B1 | 2/2002 | Shahid | |
| 6,519,395 B1 | 2/2003 | Bevan et al. | |
| 6,631,490 B2 | 10/2003 | Shimoda | |
| 6,694,083 B2 | 2/2004 | Paradiso et al. | |
| 6,795,947 B1 | 9/2004 | Siegel et al. | |
| 6,978,319 B1 | 12/2005 | Rostoker et al. | |
| 6,989,776 B2 | 1/2006 | Tsang | |
| 7,000,177 B1 | 2/2006 | Wu et al. | |
| 7,030,789 B1 | 4/2006 | Cideciyan et al. | |
| 7,044,656 B1 | 5/2006 | Hofmeister et al. | |
| 7,071,851 B1 | 7/2006 | Blaum et al. | |
| 7,103,830 B1 | 9/2006 | Dong | |
| 7,120,778 B2 | 10/2006 | Zimmer | |
| 7,174,485 B2 | 2/2007 | Silvus | |
| 7,290,184 B2 | 10/2007 | Bruner et al. | |
| 7,307,556 B2 | 12/2007 | Lee | |
| 7,362,936 B2 | 4/2008 | Stark et al. | |
| 7,409,622 B1 | 8/2008 | Lu et al. | |
| 7,515,619 B2 | 4/2009 | Juluri | |
| 7,515,797 B2 | 4/2009 | Stark et al. | |
| 7,515,798 B2 | 4/2009 | Stark et al. | |
| 7,714,748 B1 | 5/2010 | Chaichanavong | |
| 7,949,025 B2 | 5/2011 | Olea | |
| 7,962,827 B2 | 6/2011 | Tang et al. | |
| 8,049,648 B2 | 11/2011 | Chaichanavong | |
| 8,055,977 B2 | 11/2011 | Ito | |
| 8,069,391 B1 | 11/2011 | Wu et al. | |
| 8,151,162 B2 | 4/2012 | Kanaoka et al. | |
| 8,161,347 B1 | 4/2012 | Kou | |
| 8,225,148 B2 | 7/2012 | Tang et al. | |
| 8,904,258 B2 | 12/2014 | Stark | |
| 9,020,344 B2 | 4/2015 | Stark | |
| 2004/0175077 A1 | 9/2004 | Weber | |
| 2005/0259571 A1 | 11/2005 | Battou | |
| 2006/0140564 A1 | 6/2006 | Upton | |
| 2006/0159462 A1 | 7/2006 | Aronson et al. | |
| 2006/0230425 A1 | 10/2006 | Shani et al. | |
| 2009/0135868 A1 | 5/2009 | Ishibashi | |
| 2010/0061726 A1 | 3/2010 | Barbarossa et al. | |
| 2011/0025211 A1* | 2/2011 | Bae | F21K 9/135 315/113 |
| 2011/0291578 A1 | 12/2011 | Philippbar et al. | |
| 2013/0121702 A1* | 5/2013 | Han | G02B 6/4201 398/115 |
| 2014/0186023 A1 | 7/2014 | Louderback | |

OTHER PUBLICATIONS

Papadimitriou, G.I., et al., "Optical Switching: Switch Fabrics, Techniques, and Architectures," Journal of Lightwave Technology, 21(2), 384-405, Feb. 2003.

Popplewell et al., "Performance Aspects of Error Correcting Line Codes," Second IEEE National Conference on Telecommunications, pp. 47-52, 1989.

Small, B.A., et al., "The Current and Future State of Optical Switching Technologies as Related to the Data Vortex Photonic Switching Architecture," 6 pages.

Yang, Q. et al., "New Switch Fabric Architecture for Bursty Traffic," IEEE, 43-44, 2002.

* cited by examiner

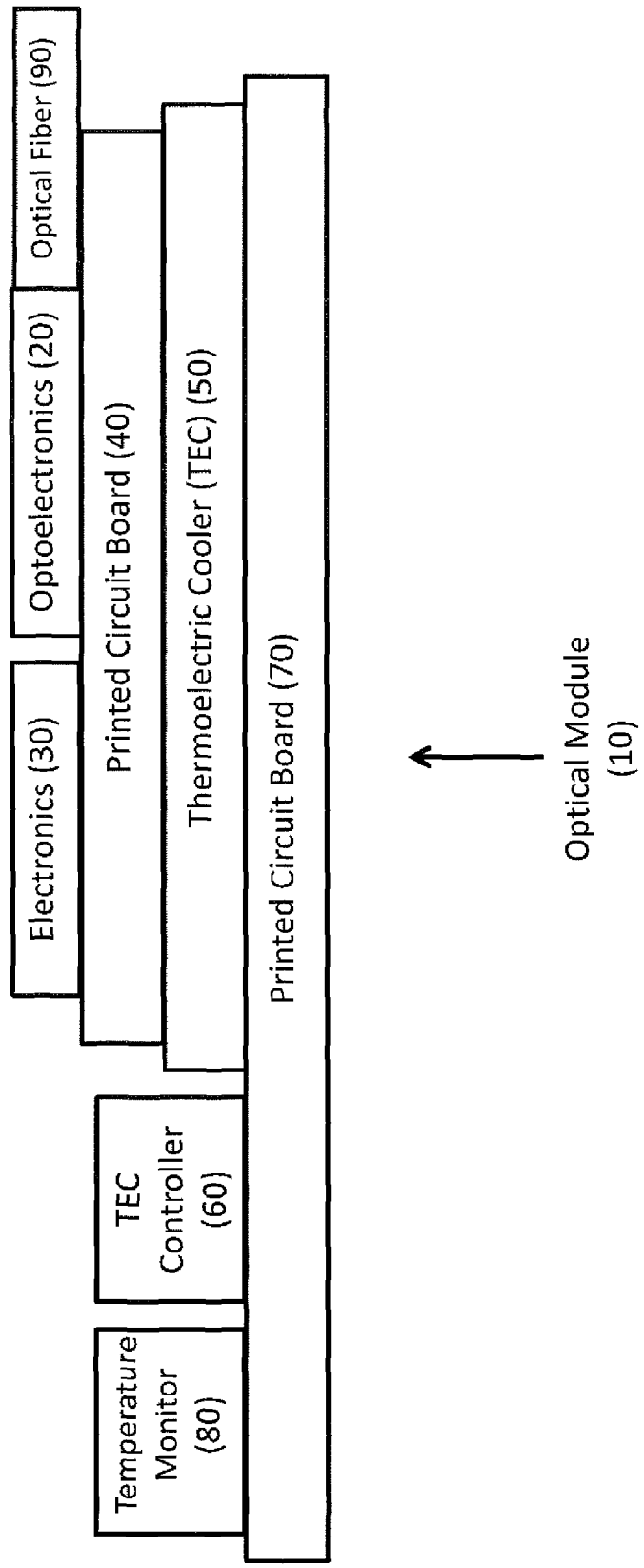

METHOD AND APPARATUS FOR IMPLEMENTING OPTICAL MODULES IN HIGH TEMPERATURES

CROSS REFERENCE TO RELATED APPLICATION

This application claims the benefit of U.S. Provisional Application Ser. No. 61/747,300 entitled "Method and Apparatus for Implementing Optical Modules in High Temperatures" filed Dec. 29, 2012. The above-referenced provisional application is hereby incorporated herein by reference in its entirety.

BACKGROUND OF THE INVENTION

This invention relates to optical modules, particularly those for operation at high temperatures. Optical modules routinely use thermoelectric coolers to stabilize the operating temperature of lasers, particularly distributed feedback (DFB) and tunable lasers. This is done to stabilize the optical power and wavelength. In this arrangement, the electronics used to drive the lasers are not placed on the thermoelectric cooler and operate at the ambient temperature where they are located. The thermoelectric cooler controller also operates at the ambient temperature where it is located. Current use of thermoelectric coolers in optical modules is focused on temperature stabilization and moderate reduction of the operating temperature of the lasers. Since the drive electronics are not placed on the thermoelectric cooler, the modules are not designed to significantly extend the operating temperature range, but to improve other laser transmitter characteristics such as optical power and wavelength stability.

SUMMARY OF THE INVENTION

An apparatus for implementing an optical module that may operate at high temperatures is provided. The optical module apparatus may have optoelectronics and electronics placed on a thermoelectric cooler to enable high temperature operation. The thermoelectric cooler controller may be implemented in electronics that may operate at high temperature and may be placed on a printed circuit board with the thermoelectric cooler.

To this end, in an embodiment of the invention, an optical module apparatus is provided. The apparatus may have a thermoelectric cooler on a first circuit board. The optical module apparatus may have a semiconductor light source and a photodetector on a second circuit board. The second circuit board may be on the thermoelectric cooler. A thermoelectric cooler controller may be mounted to the first circuit board. The thermoelectric cooler controller may not be located on or mounted to the thermoelectric cooler.

In an embodiment, the apparatus may have electronics on the second circuit board to interface with the semiconductor light source and the photodetector. The optical module apparatus also may have an optical fiber with optics on the second circuit board to couple light from the semiconductor light source into the optical fiber and from the optical fiber onto the photodetector.

In another embodiment of the invention, an optical module apparatus is provided. The apparatus may have a combination of one or more semiconductor light sources and one or more photodetectors. The apparatus also may have a thermoelectric cooler and electronics to control the thermoelectric cooler. The apparatus may have a temperature monitor and electronics to interface with the semiconductor light sources and the photodetectors. The optical module apparatus may have one or more optical fibers and optics to couple light from the semiconductor light sources into the optical fibers and from the optical fibers onto the photodetectors. The semiconductor light sources, photodetectors, optics, and electronics to interface with semiconductor light sources and photodetectors are located on the thermoelectric cooler and the electronics to control thermoelectric cooler are not located on the thermoelectric cooler.

In an embodiment, the thermoelectric cooler may be designed to have high reliability at high temperatures.

In an embodiment, the optical module operates at an ambient temperature above 100° C.

In an embodiment, the electronics to control the thermoelectric cooler operate at the ambient temperature of the optical module or higher.

In an embodiment, the thermoelectric cooler maintains a temperature lower than ambient where the semiconductor light sources, photodetectors, optics, and electronics to interface with semiconductor light sources and photodetectors are located.

In an embodiment, the temperature lower than ambient may be sufficiently low to enable required functionality and reliability of the optical module.

A further embodiment of the invention provides a method of implementing an optical module. The method may have the steps of providing a thermoelectric cooler on a first circuit board; providing a semiconductor light source and a photodetector on a second circuit board; situating the second circuit board on the thermoelectric cooler; and providing a thermoelectric cooler controller on the first circuit board.

In an embodiment, the method may have the further steps of providing an optical fiber; and providing optics on the second circuit board to couple light from the semiconductor light source into the optical fiber and from the optical fiber onto the photodetector.

Another embodiment of the invention provides a method of implementing an optical module. The method may have the steps of providing a thermoelectric cooler on a first circuit board; providing an optoelectronic component and an electronic component on a second circuit board; placing the second circuit board on the thermoelectric cooler; and providing a thermoelectric cooler controller on the first circuit board.

An advantage of the invention is to provide a method and optical module apparatus that may operate at high temperatures, substantially higher temperatures than ambient temperature.

An advantage of the invention is to provide a method and optical module apparatus having the optoelectronics and electronics (except for the thermoelectric cooler controller) on a thermoelectric cooler.

Another advantage of the invention is to provide a method and optical module apparatus having the electronics for controlling the thermoelectric cooler only requiring relatively simple, low-speed electronics that may be implemented in integrated circuit technologies that may operate at very high temperatures (200° C. or higher), making it possible to control the thermoelectric cooler with uncooled electronics.

BRIEF DESCRIPTION OF THE DRAWING

FIG. 1 is a schematic diagram of an embodiment of an optical module showing optoelectronics and electronics placed on a thermoelectric cooler to enable high temperature operation. The thermoelectric cooler controller may be implemented in electronics that may operate at high temperature and may be located on a printed circuit board with the thermoelectric cooler.

DETAILED DESCRIPTION OF THE INVENTION

An apparatus for implementing an optical module that may operate at high temperatures is provided. FIG. 1 is a schematic diagram of an embodiment of an apparatus of an optical module showing optoelectronics and electronics placed on a thermoelectric cooler to enable high temperature operation. The thermoelectric cooler controller may be implemented in electronics that may operate at high temperature and may be placed on a printed circuit board with the thermoelectric cooler.

Typically, the operating temperature of optical modules may be limited by the temperature performance and reliability of the optoelectronic components and their associated drive and receiver electronics. By placing the optoelectronic components and their associated drive and receiver electronics on a thermoelectric cooler, their effective operating temperature may be reduced, enabling an optical module that may work at higher temperatures than may normally be achieved. Electronics are also required to control the thermoelectric cooler, but these functions are low-speed and relatively simple, enabling them to be implemented in integrated circuit technologies that may operate at very high temperatures. This enables the thermoelectric cooler controller electronics to be operated uncooled at the operating temperature of the optical module. The apparatus enables optical modules that may operate at temperatures substantially higher than current optical modules.

Referring to the drawing, FIG. 1 is a schematic diagram of an embodiment of an optical module apparatus 10. The optical module apparatus 10 may have optoelectronics 20 and electronics 30 located on a first printed circuit board (PCB) 40. The PCB 40 may be located on a thermoelectric cooler (TEC) 50. The optical module apparatus 10 also may have a thermoelectric cooler controller (TEC controller) 60. In the embodiment shown, the TEC controller 60 may be located separate and apart from the thermoelectric cooler 50. As shown, the TEC controller 60 may be located on a second printed circuit board 70. The TEC controller 60 may comprise electronics for controlling the TEC 50. A temperature monitor 80, such as a thermistor or a thermocouple, may be used to monitor the ambient temperature of the optical module apparatus 10 and may provide an input to the TEC controller 60 which may control the thermoelectric cooler 50. The light from the semiconductor light sources in the optoelectronics 20 may be coupled into optical fibers 90. The light in the optical fibers 90 may be coupled onto the photodetectors in the optoelectronics 20.

Typically, the operating temperature of the optical module 10 may be limited by the temperature performance and reliability of the components of the optoelectronics 20 and their associated drive and receiver electronics 30. By placing the components of the optoelectronics 20 and their associated drive and receiver electronics 30 on the thermoelectric cooler 50, the effective operating temperature of the components of the optoelectronics 20 may be reduced. Thus, the optical module 10 may be enabled to operate at higher temperatures than may normally be achieved. The electronics typically required to control the thermoelectric cooler may function at low-speed and are relatively simple. Thus, the electronics of the TEC controller 60 may be implemented in integrated circuit technologies that may operate at very high temperatures. Such an implementation may enable the electronics for the TEC controller 60 to be operated in an uncooled manner at the operating temperature of the optical module 10. Thus, the present invention may enable the optical module 10 to operate at temperatures substantially higher than current optical modules.

It should be understood that various changes and/or modifications to the presently preferred embodiments described herein will be apparent to those skilled in the art. Such changes and/or modifications may be made without departing from the spirit and/or scope of the present invention and without diminishing its attendant advantages. It is, therefore, intended that such changes and/or modifications be covered by the appended claims.

The invention claimed is:

1. An optical module apparatus comprising:
optoelectronics including one or more semiconductor light sources and one or more photodetectors, the optoelectronic being located on a first printed circuit board;
electronics interfacing with the one or more semiconductor light sources and the one or more photodetectors located on the first printed circuit board;
one or more optical fibers optically coupled to the one or more semiconductor light sources and the one or more photodetectors, the one or more optical fibers being configured to receive light from the one or more semiconductor light sources and to transmit light to the one or more photodetectors;
a thermoelectric cooler located on a second printed circuit board and sandwiched between the first printed circuit board and the second printed circuit board, the thermoelectric cooler being configured to receive the first printed circuit board, the thermoelectric cooler being configured to cool at least the optoelectronics located on the first printed circuit board; and
a thermoelectric cooler controller located on the second printed circuit board, the thermoelectric cooler controller being configured to control the thermoelectric cooler,
wherein the thermoelectric cooler controller is spaced apart from the thermoelectric cooler.

2. The optical module apparatus of claim 1, further comprising:
a temperature monitor located apart from the thermoelectric cooler, the temperature monitor being electrically connected to the thermoelectric cooler controller, wherein the temperature monitor is configured to monitor a temperature of the optical module apparatus and input into to the thermoelectric cooler controller an input associated with the temperature of the optical module apparatus.

3. The apparatus of claim 1, wherein the one or more semiconductor light source comprise a light emitting diode (LED), a vertical-cavity surface-emitting laser (VCSEL), a Fabry-Perot laser, or a distributed feedback (DFB) laser.

4. The apparatus of claim 1, wherein the one or more photodetectors comprise a p-i-n photodetector, an avalanche photodetector, or a metal-semiconductor-metal (MSM) photodetector.

5. The apparatus of claim 2, wherein the temperature monitor comprises a thermistor or a thermocouple.

6. The apparatus of claim 1, wherein the one or more optical fibers includes a single mode fiber or a multimode fiber.

7. The apparatus of claim 1, wherein the optical module apparatus is configured to operate at an ambient temperature above 100° C.

8. The apparatus of claim 1, wherein the thermoelectric cooler controller is configured to operate at or above an ambient temperature of the optical module apparatus.

9. The apparatus of claim 1, wherein the thermoelectric cooler is configured to maintain a temperature lower than an ambient temperature on the first printed circuit board.

10. The apparatus of claim 9, wherein the thermoelectric cooler is configured to maintain the lower than ambient temperature on the first printed circuit board to improve functionality or reliability of the optical module apparatus.

11. The apparatus of claim 1, comprising:
an optical transceiver, an optical transmitter, an optical receiver, or an optical interrogator.

12. The apparatus of claim 1, wherein the optical module apparatus is configured to transmit digital data or analog data.

13. The apparatus of claim 1, wherein the optical module apparatus is configured to implement data interconnects for control systems or for clock signal distribution.

14. The optical module apparatus of claim 1, comprising:
optics located on the first circuit board and arranged to optically couple the semiconductor light sources to the optical fibers and optically couple the optical fibers to the photodetectors.

15. The optical module apparatus of claim 1, wherein the thermoelectric cooler is in thermal contact with the first printed circuit board so as to cool at least the optoelectronics located on the first printed circuit board.

16. An optical module apparatus comprising:
a thermoelectric cooler located on a first circuit board;
a semiconductor light source and a photodetector located on a second circuit board distinct from the first circuit board, the second circuit board being located on the thermoelectric cooler, the thermoelectric cooler being sandwiched between the first circuit board and the second circuit board, the thermoelectric cooler being configured to cool at least the semiconductor light source and the photodetector located on the second circuit board;
one or more optical fibers optically coupled to the semiconductor light source, the one or more optical fibers being configured to receive light from the semiconductor light source; and
a thermoelectric cooler controller mounted to the first circuit board, the thermoelectric cooler controller being configured to control the thermoelectric cooler located on the first circuit board.

17. The apparatus of claim 16 further comprising:
electronics located on the second circuit board, the electronics being configured to interface with the semiconductor light source and the photodetector;
wherein the one or more optical fibers are optically coupled to the semiconductor light source and the photodetector.

18. The optical module apparatus of claim 16, comprising:
optics located on the second circuit board and arranged to optically couple the semiconductor light source to the optical fiber and optically couple the optical fiber to the photodetector.

19. A method of implementing an optical module, the method comprising:
mounting a thermoelectric cooler on a first circuit board;
mounting a semiconductor light source and a photodetector on a second circuit board separate from the first circuit board;
mounting the second circuit board on the thermoelectric cooler so that the thermoelectric cooler is sandwiched between the first circuit board and the second circuit board;
mounting a thermoelectric cooler controller on the first circuit board;
optically coupling the semiconductor light source to the photodetector; and
connecting an optical fiber to the semiconductor light source.

20. The method of claim 19 further comprising:
optically coupling using optics on the second circuit board the semiconductor light source to the optical fiber and optically coupling the optical fiber to the photodetector.

21. A method of implementing operating an optical module, the method comprising:
cooling, using a thermoelectric cooler located on a first circuit board, components on a second circuit board, the second circuit board being located on the thermoelectric cooler, the second circuit board being separate from the first circuit board so that the thermoelectric cooler is sandwiched between the first circuit board and the second circuit board, wherein the components on the second circuit board include an optoelectronic component, an electronic component, and one or more optical fibers optically coupled to the optoelectronic component; and
controlling, using a thermoelectric cooler controller located on the first circuit board and separate from the thermoelectric cooler, the cooling of the components using the thermoelectric cooler.

22. The method of claim 21, further comprising:
monitoring, using a temperature monitoring device located on the first circuit board, an ambient temperature of the optical module; and inputting the ambient temperature to the thermoelectric cooler controller.

23. The method of claim 21, wherein the first circuit board is in contact with the thermoelectric cooler and operates as a heat sink to cool at least the optoelectronics located on the first printed circuit board.

* * * * *